(12) United States Patent
Liao et al.

(10) Patent No.: US 6,261,900 B1
(45) Date of Patent: Jul. 17, 2001

(54) METHOD FOR FABRICATING A DRAM CAPACITOR

(75) Inventors: Wunn-Shien Liao; Ching-ming Lee, both of Hsinchu; Jau-Hone Lu, Hsinchu Hsien, all of (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/518,878

(22) Filed: Mar. 6, 2000

(30) Foreign Application Priority Data

Nov. 6, 1999 (TW) .................................................. 08811940

(51) Int. Cl.$^7$ .............................................. H01L 21/8242
(52) U.S. Cl. ......................... 438/253; 438/254; 438/255
(58) Field of Search ................................... 438/238–241, 438/393–399, 381, 250–256

(56) References Cited

U.S. PATENT DOCUMENTS

| | | |
|---|---|---|
| 5,891,768 | 4/1999 | Figura et al. . |
| 5,904,522 | 5/1999 | Chao . |
| 6,013,733 * | 1/2000 | Lee et al. ............................. 438/253 |
| 6,015,734 * | 1/2000 | Huang et al. ........................ 438/253 |

* cited by examiner

*Primary Examiner*—Jey Tsai
(74) *Attorney, Agent, or Firm*—Darby & Darby

(57) ABSTRACT

The present invention relates to a method of fabricating a DRAM capacitor. As the capability of the charges stored in the capacitor is in proportion to the area of the capacitor plates, the electrodes of the DRAM capacitor according to the present invention is bowl-shaped such that the area of the capacitor increases. Further, the process is simple, and the height of the bowl-shaped capacitor is not as large as that of the conventional capacitor.

11 Claims, 10 Drawing Sheets

METHOD FOR FABRICATING A DRAM CAPACITOR

BACKGROUND OF THE INVENTION

1. Field of the Invention

The present invention relates to a method for fabricating a semiconductor memory device, and more particularly to a method for fabricating a bowl-shaped capacitor for a dynamic random access memory (DRAM).

2. Description of the Prior Art

Please refer to FIGS. 1A through 1F, wherein the cross-sectional views of a conventional method for fabricating a DRAM cell are depicted in sequence.

Referring to FIG. 1A, a P-type semiconductor substrate 10 having a shallow trench isolation STI and transistors comprising gates G1, G2, G3 and N-type source and drain regions 12a, 12b, 12c is shown, wherein the gates G1, G2, G3 comprise an oxide layer 15, a polosilicon layer 16, a tungsten silicide layer 18, a silicon nitride masking layer 20, and a silicon nitride spacer 14.

Referring to FIG. 1B, a first insulating layer 24, for example, an oxide layer is formed on the semiconductor substrate 10. Subsequently, a first opening 26 for exposing the drain region 12b is formed by etching the first insulating layer 24. As shown in FIG. 1C, a bit line BL comprising a polysilicon layer 32 and a tungsten silicide layer 33 is then formed in the first opening 26.

Please refer to FIG. 1D. A second insulating layer 34, such as an oxide layer is globally formed on the first insulating layer 24. Subsequently, a second opening 35 for exposing the source region 12c is formed by etching the second and the first insulating layers 34 and 24.

Referring to FIG.1E, a conventional stacked capacitor is then formed by the following steps: forming a contact 51 in the second opening 35; forming a bottom electrode (conducting plate) 50 on the contact 51; forming a dielectric layer 52 on the bottom electrode 50; and forming an upper electrode (conducting plate) 54 on the dielectric layer 52. As well known by those persons skilled in this field, the most important parameters effecting the charges stored in the capacitor are the area of the capacitor plates, the dielectric constant, and the thickness of the insulator. Therefore, many approaches have been developed to increase the area of the electrodes by using different structures for the stacked capacitors to. For example, a crown capacitor is described in the U.S. Pat. No. 5,891,768, and a branch capacitor recited in the U.S. Pat. No. 5,904,522. However, the processes mentioned above are complicated, as etching and depositing steps must be very precise. Thus, the complexity and the cost of the processes are increased.

SUMMARY OF THE INVENTION

Accordingly, the object of the present invention is to provide a simple and inexpensive method for fabricating a capacitor in a DRAM cell, wherein the area of the electrodes is large.

To attain the above-mentioned object, a method for fabricating a DRAM capacitor is provided. The method comprises the following steps: (a) providing a semiconductor substrate having a transistor and a bit line; (b) forming a lower insulating layer covering the transistor and the bit line, an etching stop layer, and an upper insulating layer;(c) forming a photoresist layer having an opening on the upper insulating layer;(d) forming a bowl-shaped opening by wet etching the upper isolating layer by the pattern of the opening in the photoresist layer; forming a contact window by dry etching the etching stop layer and the lower isolating layer by the pattern of the bowl-shaped opening and the opening in the photoresist layer; (e) removing the photoresist layer; (f) forming a first conducting layer on the upper isolating layer and filling the contact window; and (g) forming a bowl-shaped capacitor by forming a dielectric layer and a second conducting layer on the first conducting layer.

BRIEF DESCRIPTION OF THE DRAWINGS

The present invention will become more fully understood from the detailed description given hereinbelow and the accompanying drawings, given by way of illustration only and thus, not intended to be limitative of the present invention.

DETAILED DESCRIPTION OF THE INVENTION

Figure 1A:
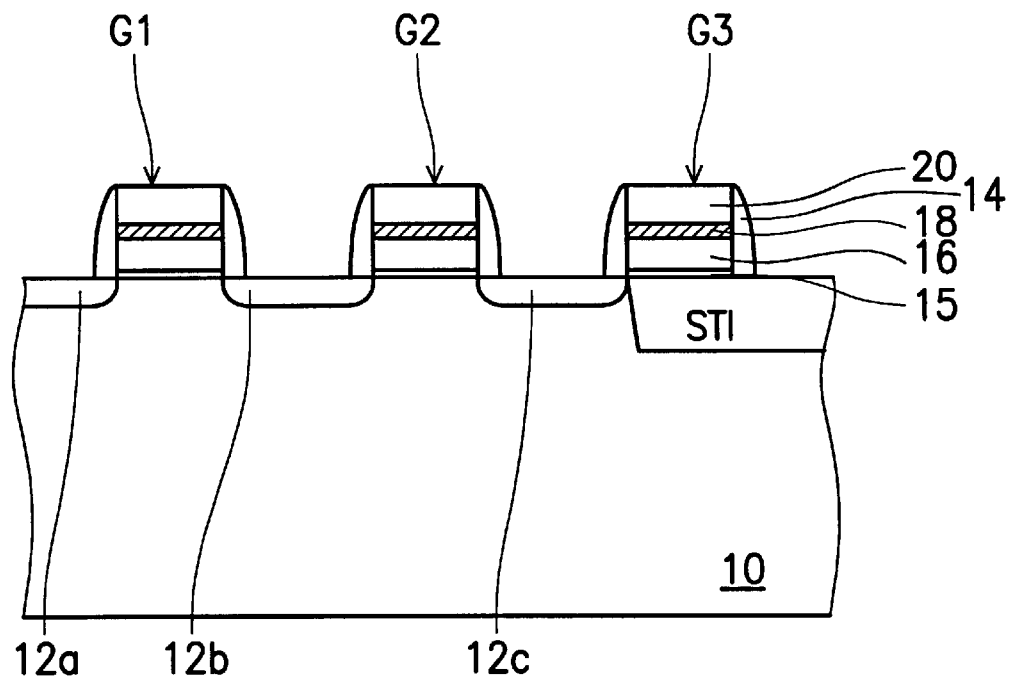
FIG. 1A though FIG. 1E schematically depict in cross-sectional views steps involved in a conventional method for fabricating a DRAM capacitor.
Figure 1B:
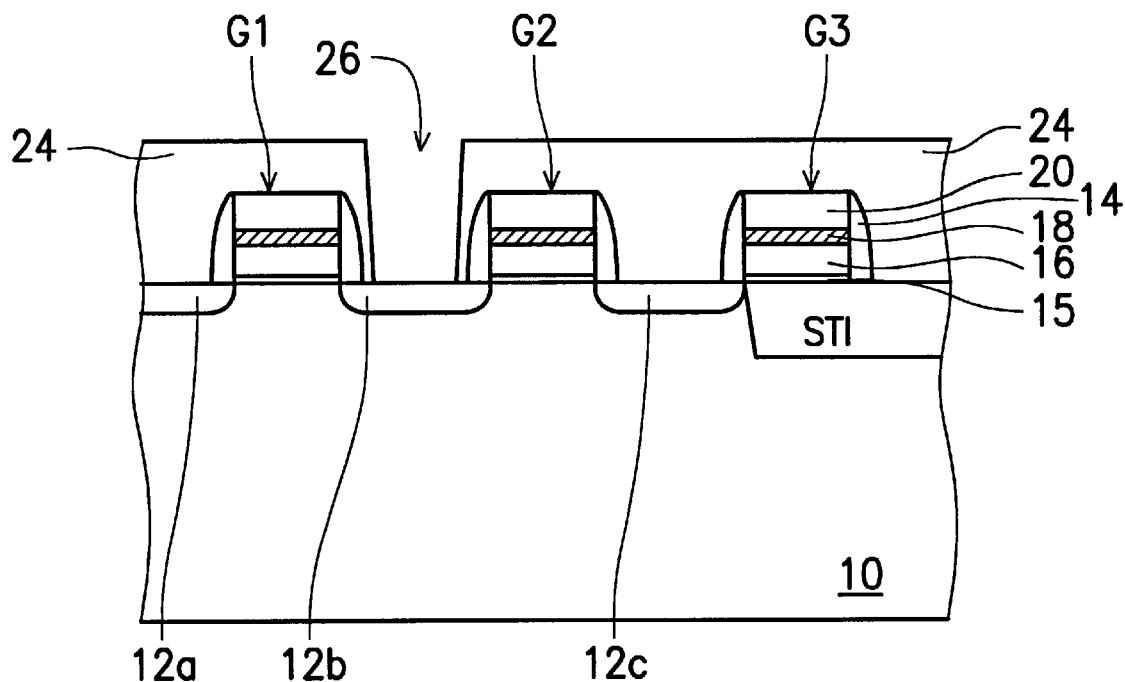
Figure 1C:
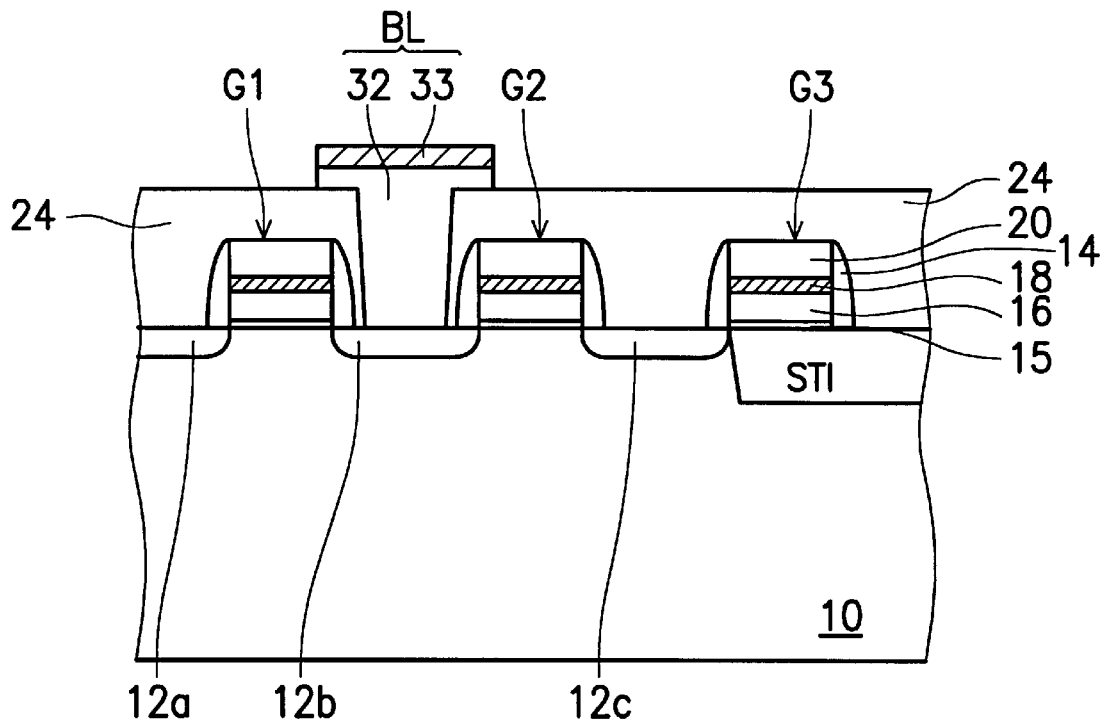
Figure 1D:
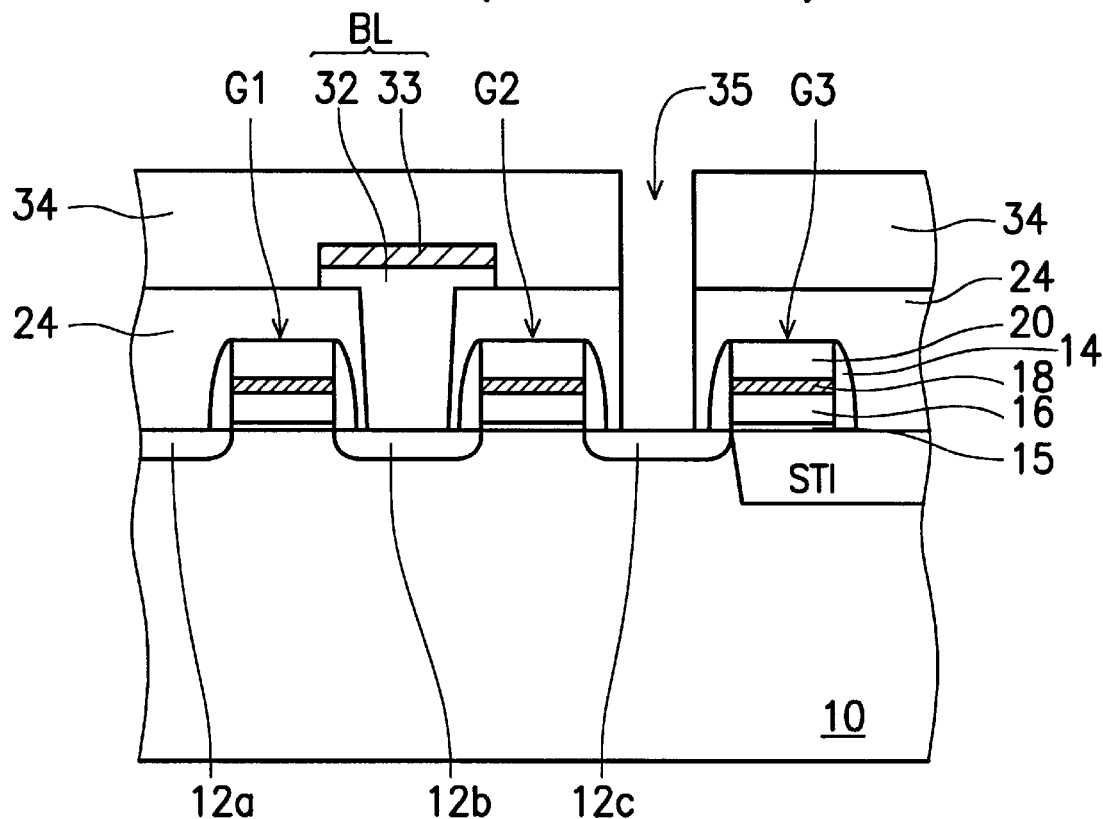
Figure 1E:
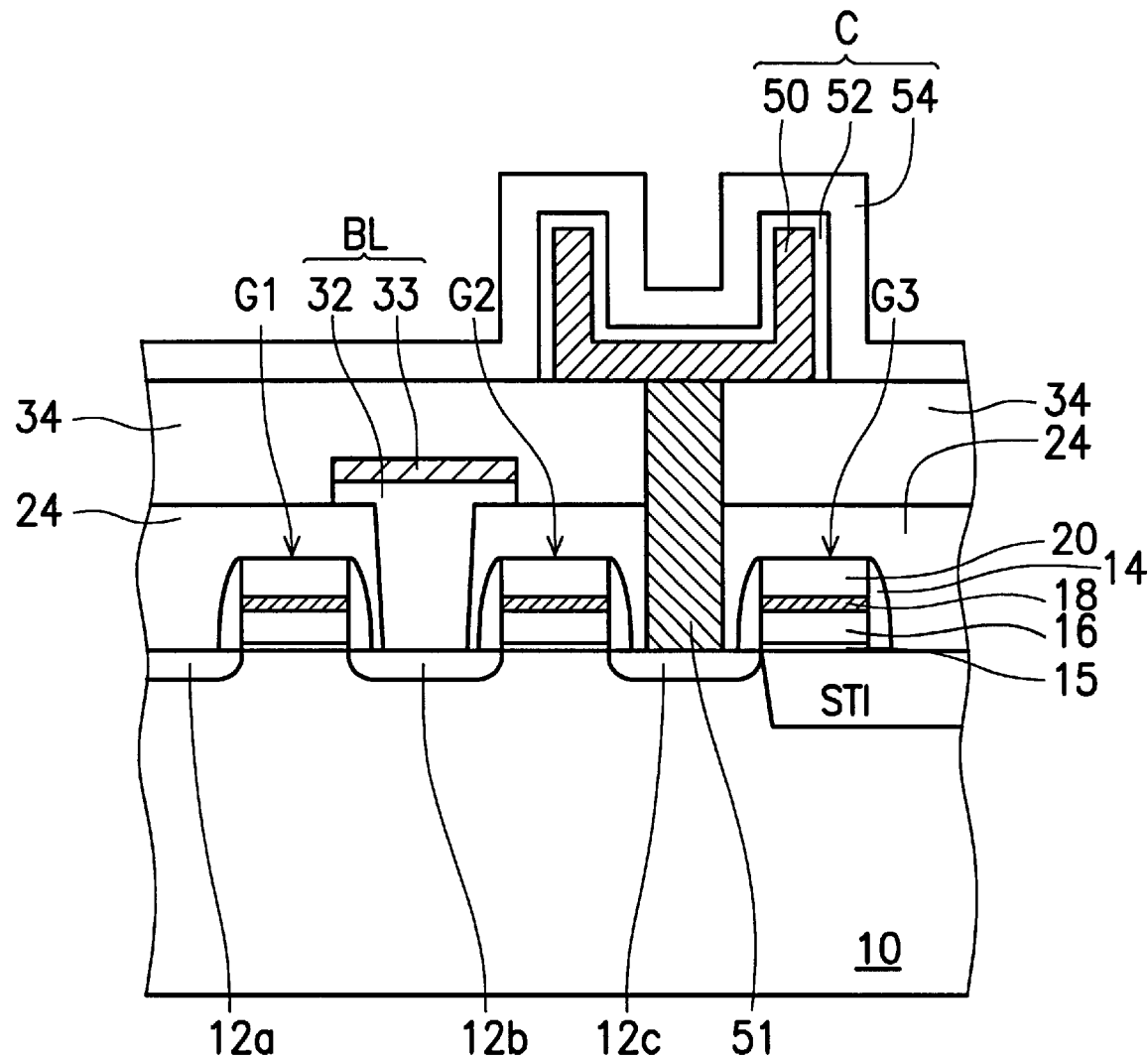
Figure 2A:
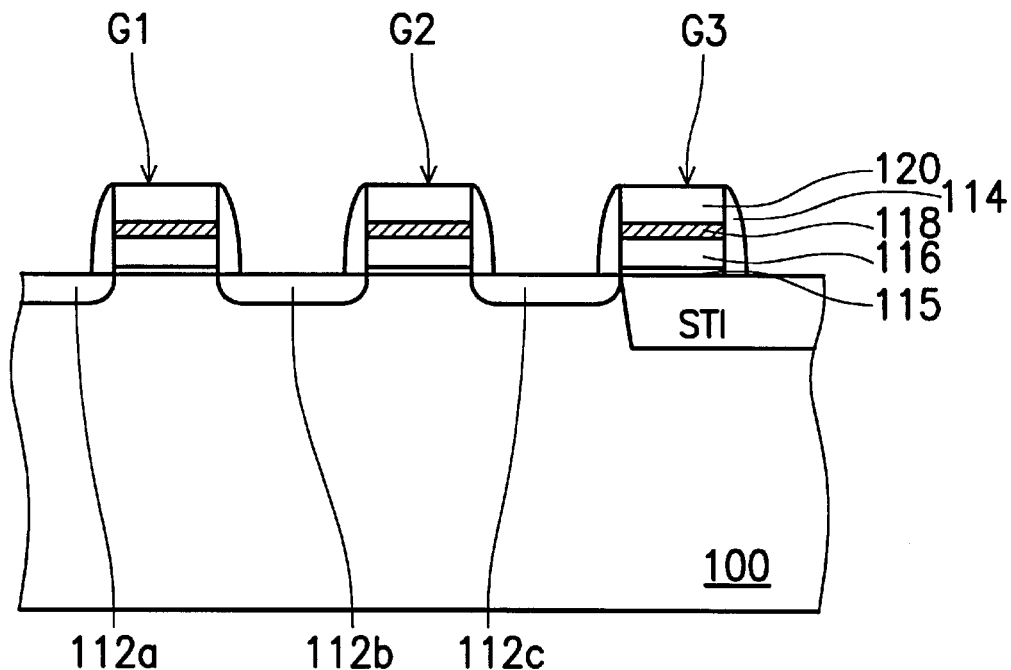
FIG. 2A though FIG. 2H schematically depict in cross-sectional views steps involved in a method for fabricating a DRAM capacitor according to the present invention.

Referring to FIG. 2A, a semiconductor substrate such as a P-type silicon substrate 100 is provided. A shallow trench isolation STI is then formed on the silicon substrate 100. Subsequently, transistors comprising gates G1, G2, G3 and source and drain regions 112a, 112b, 112c are formed on the silicon substrate 110 by utilizing the conventional process, wherein the gates G1, G2, G3 comprise a gate oxide 115, a polosilicon layer 116, a tungsten silicide layer 118, a silicon nitride masking layer 120, and a silicon nitride spacer 114. In addition, the source and drain regions 112a,112b, 112c are doped with, for example, Arsenic ions.

Figure 2B:
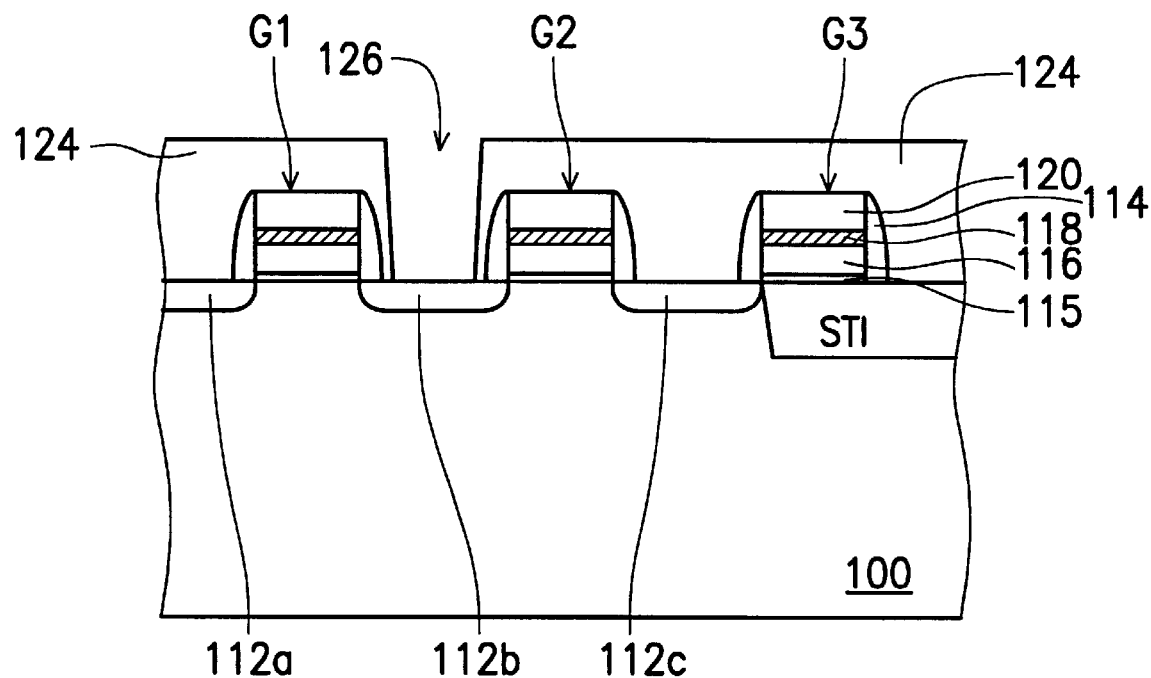

Referring to FIG.2B, a first isolating layer 124 is deposited on the silicon substrate 110. For example, a silicon dioxide layer 124 is deposited by LPCVD (low-pressure chemical vapor deposition) on the silicon substrate 100. A first opening 126 is then formed by etching the isolating layer 124 so that the drain region 112b is exposed. For example, the silicon dioxide layer 124 is etched by anisotropic etching process to expose the drain region 112b of the transistor.

Figure 2C:
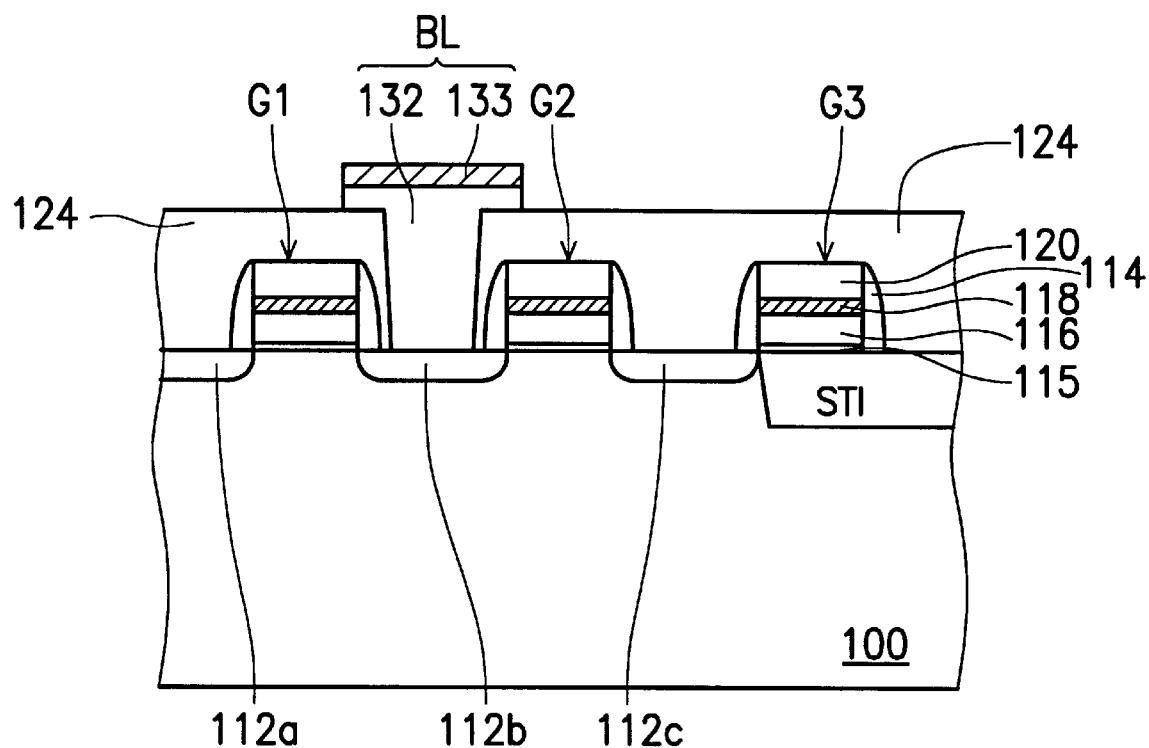

Referring to FIG. 2C, a bit line BL comprising a polysilicon layer 132 and a tungsten silicide layer 133 is formed in the first opening 126. For example, the polysilicon layer 132 is formed by CVD, and the tungsten silicide layer 133 is formed by sputtering a tungsten layer (not shown) on the polysilicon layer 132, thereafter, the polysilicon layer 132 is annealed to form a tungsten silicide layer 133 on the polysilicon layer 132, wherein the first opening 126 is filled with the polysilicon layer 132. Subsequently, the polysilicon layer 132 and the tungsten silicide layer 133 are defined by photolithography and etching processes so that the bit line BL is formed in the first opening 126.

Figure 2D:
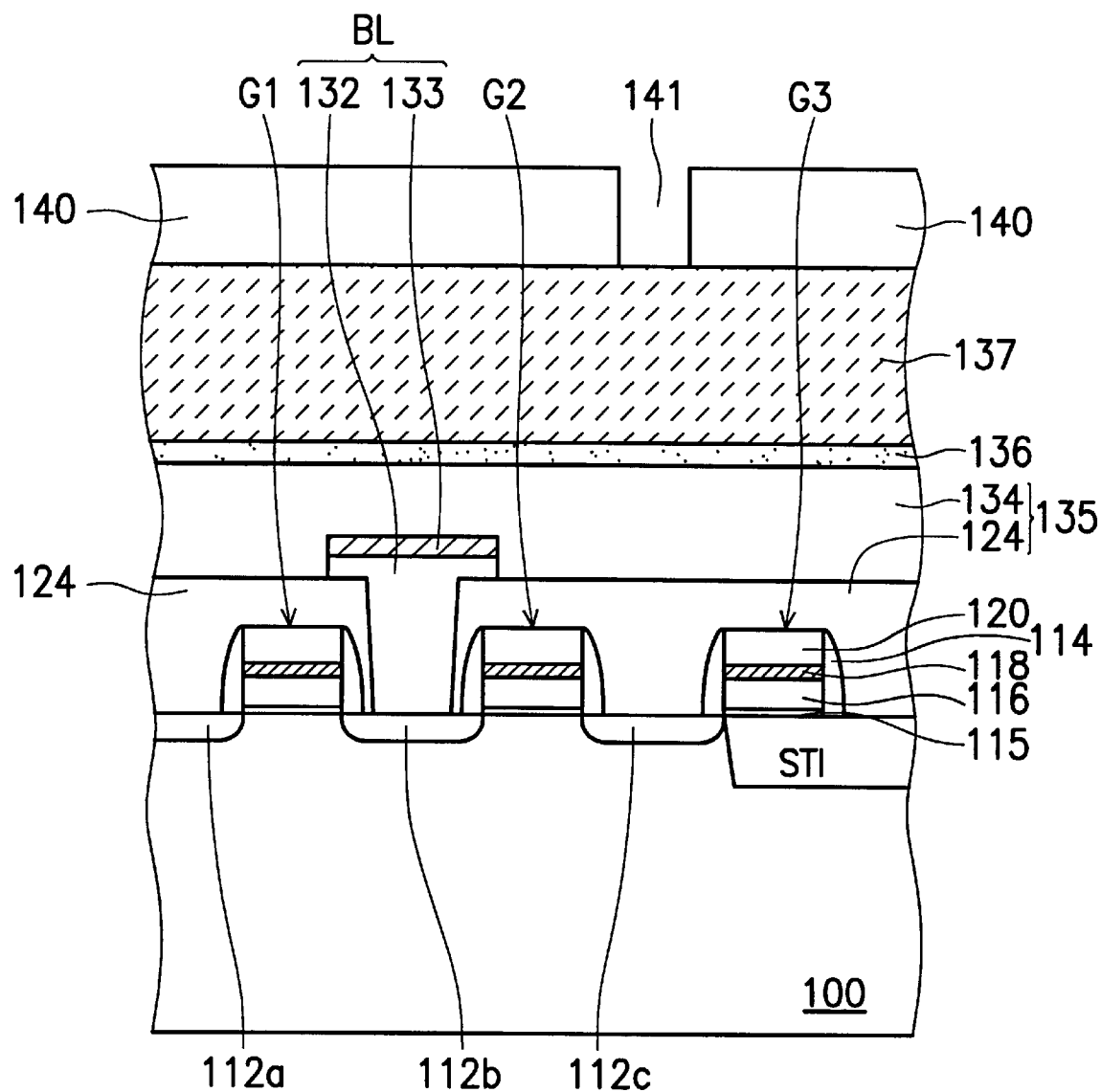

Referring to FIG.2D, an isolating layer 134, an etching stop layer 136, and an upper isolating layer 137 are formed globally to cover the transistor regions and the bit line BL, wherein the isolating layer 134 and said isolating layer 124 are denominated a lower isolating layer 135. Additionally, a photoresist layer 140 having a second opening 141 is formed on the upper isolating layer 137. For example, a TEOS layer 134 doped with boron and phosphorous ions is deposited by the CVD process, and then a silicon nitride layer 136 and an un-doped glass layer 137 are deposited on the TEOS layer 134 in sequence. Next, a photoresist layer 140 is coated on the un-doped glass layer 137. After the processes of exposure and development, the second opening 141 is formed in the photoresist layer 140 so that a contact window is formed thereafter by the pattern of the second opening 141.

Figure 2E:
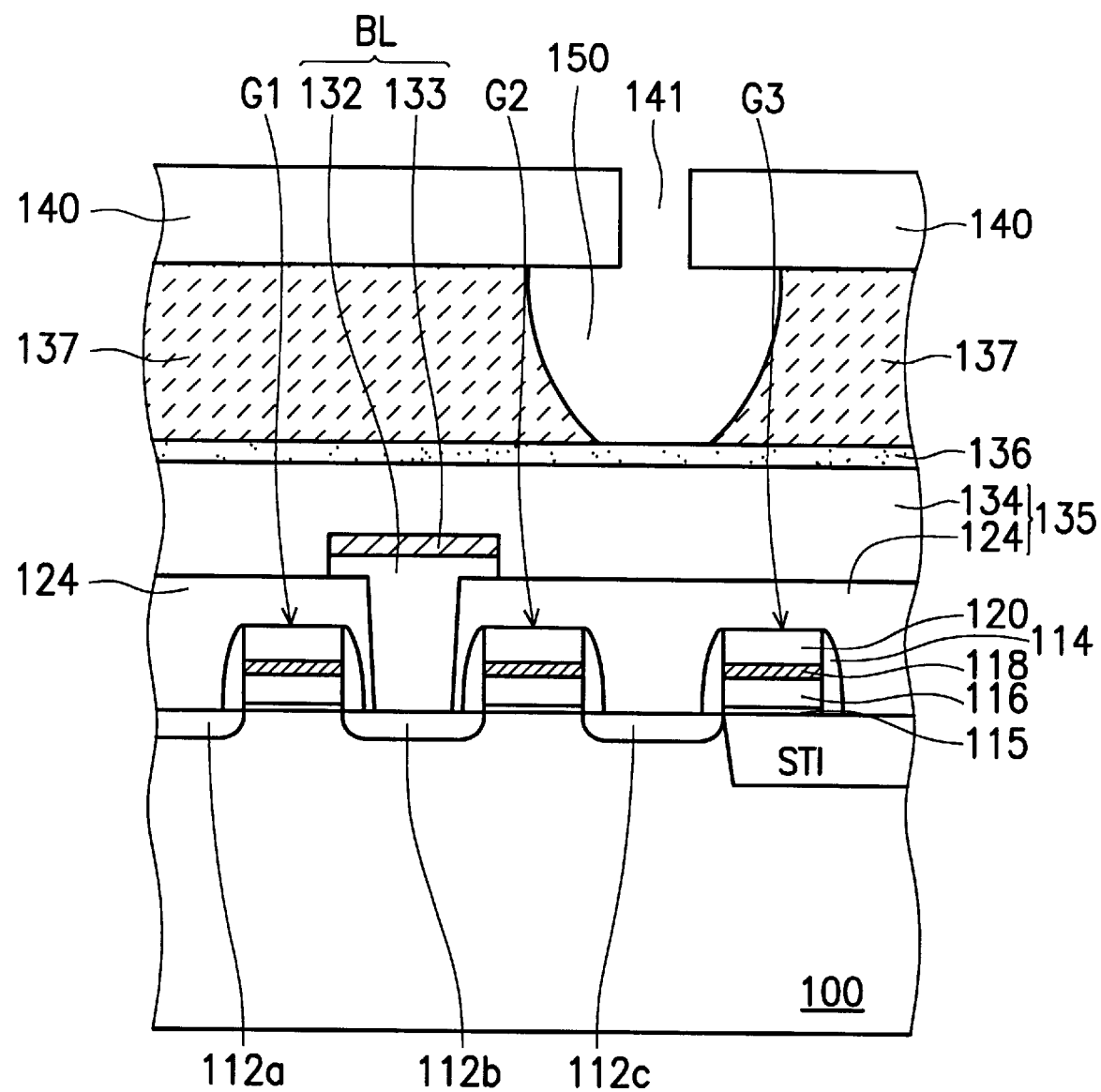

Referring to FIG. 2E, a bowl-shaped opening 150 is formed by etching the upper isolating layer 137 and stopping at the etching stop layer 136. For example, the un-doped glass layer 137 is etched by wet etching with an etchant of a diluted HF solution or a buffer HF solution. As the wet etching is an isotropic etching process, an undercut phenomenon is caused in the un-doped glass layer 137. Therefore, a bowl-shaped opening 150 is formed, and a portion of the silicon nitride layer is exposed.

Figure 2F:
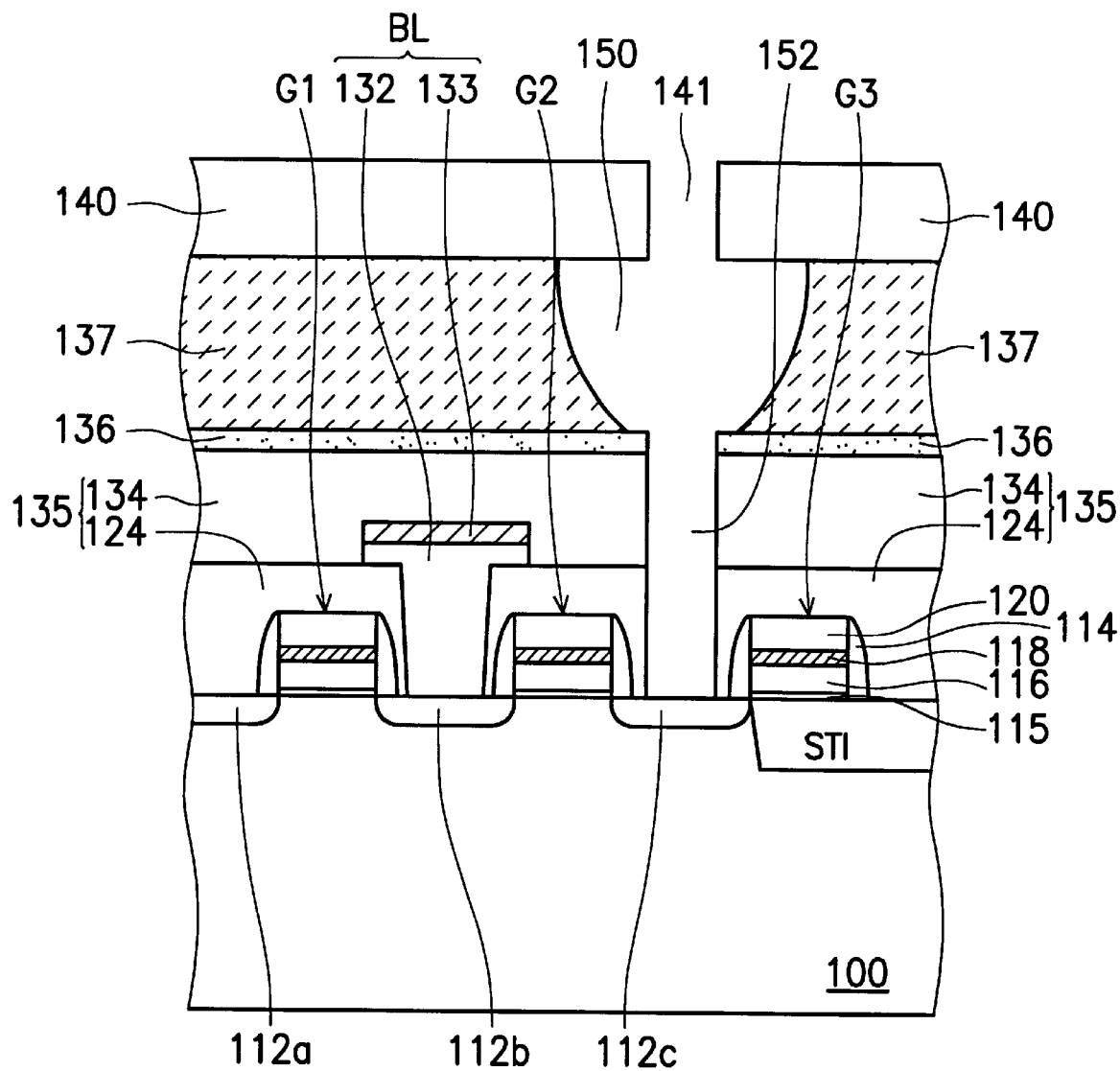

Referring to FIG. 2F, a contact window 152 is formed in the etching stop layer 136 and the lower isolating layer 135. For example, the contact window 152 is formed by dry etching with an etchant of plasma, such that the source region 112c is exposed.

Figure 2G:
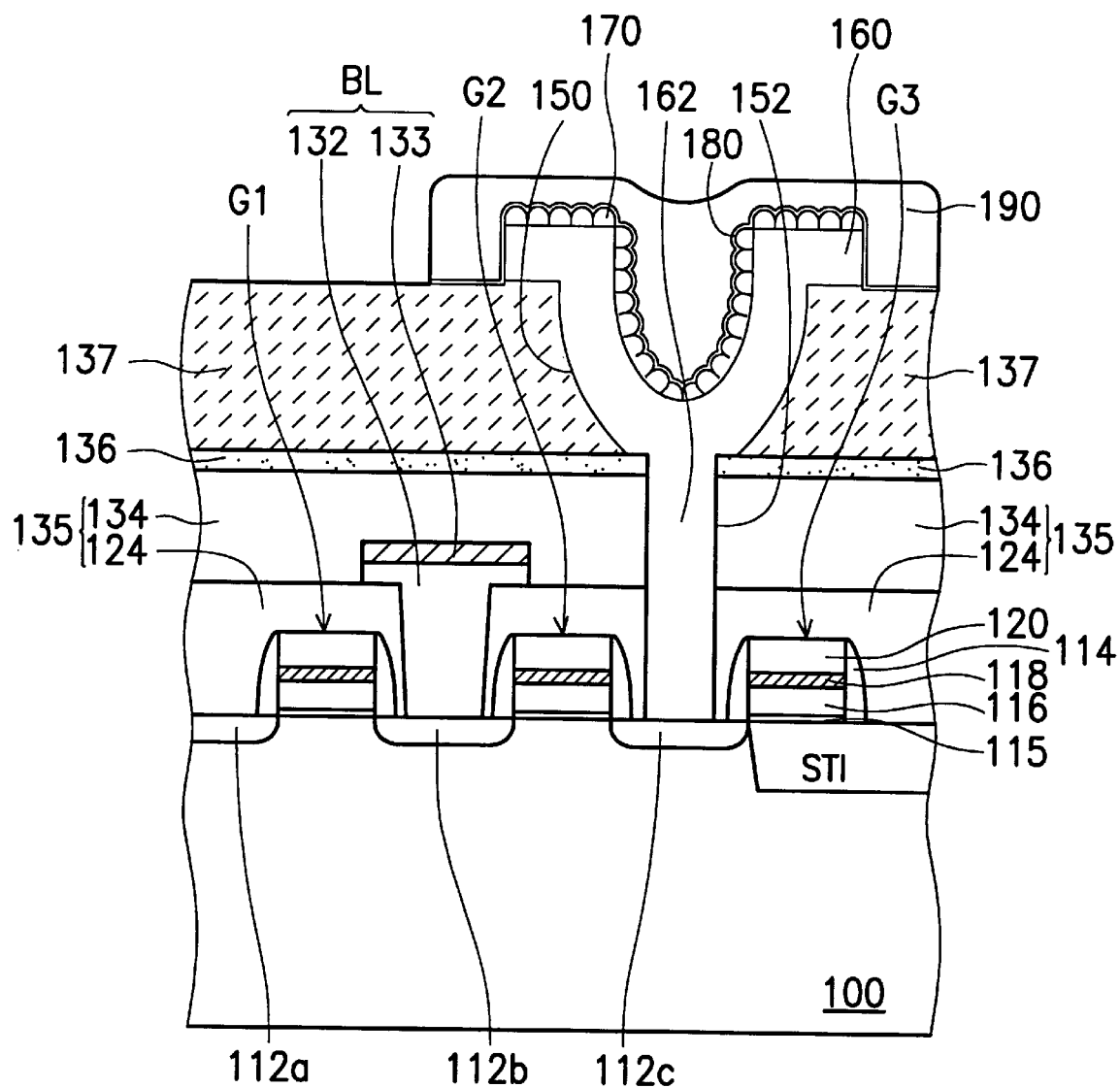

Referring to FIG. 2G, in which the photoresist layer 140 is removed, and a conducting layer 160 is conformally formed on the upper isolating layer 137 and filled in the bowl-shaped opening 150 and the contact window 152. For example, after removing the photoresist layer 140, a polysilicon layer (not shown) is deposited conformally on the un-doped glass layer 137 and filled in the bowl-shaped opening 150 and the contact window 152 by a CVD process, wherein the polysilicon filled into the contact window 152 is denominated contact plug 162. Subsequently, a bottom electrode (conducting layer) 160 is formed by defining the polysilicon layer. For example, one method to define the polysilicon layer and increase the area of the bottom electrode is to form a hemispherical-grain (HSG) layer 170 as shown in FIG. 2G. Subsequently, a dielectric layer 180 and an upper electrode (conducting layer) 190 are formed in sequence so that a capacitor is completed. For example, the dielectric layer 180 is a silicon dioxide/silicon nitride/silicon dioxide (ONO) layer deposited by CVD processes, and the upper electrode (conducting layer) 190 is made of polysilicon.

Figure 2H:
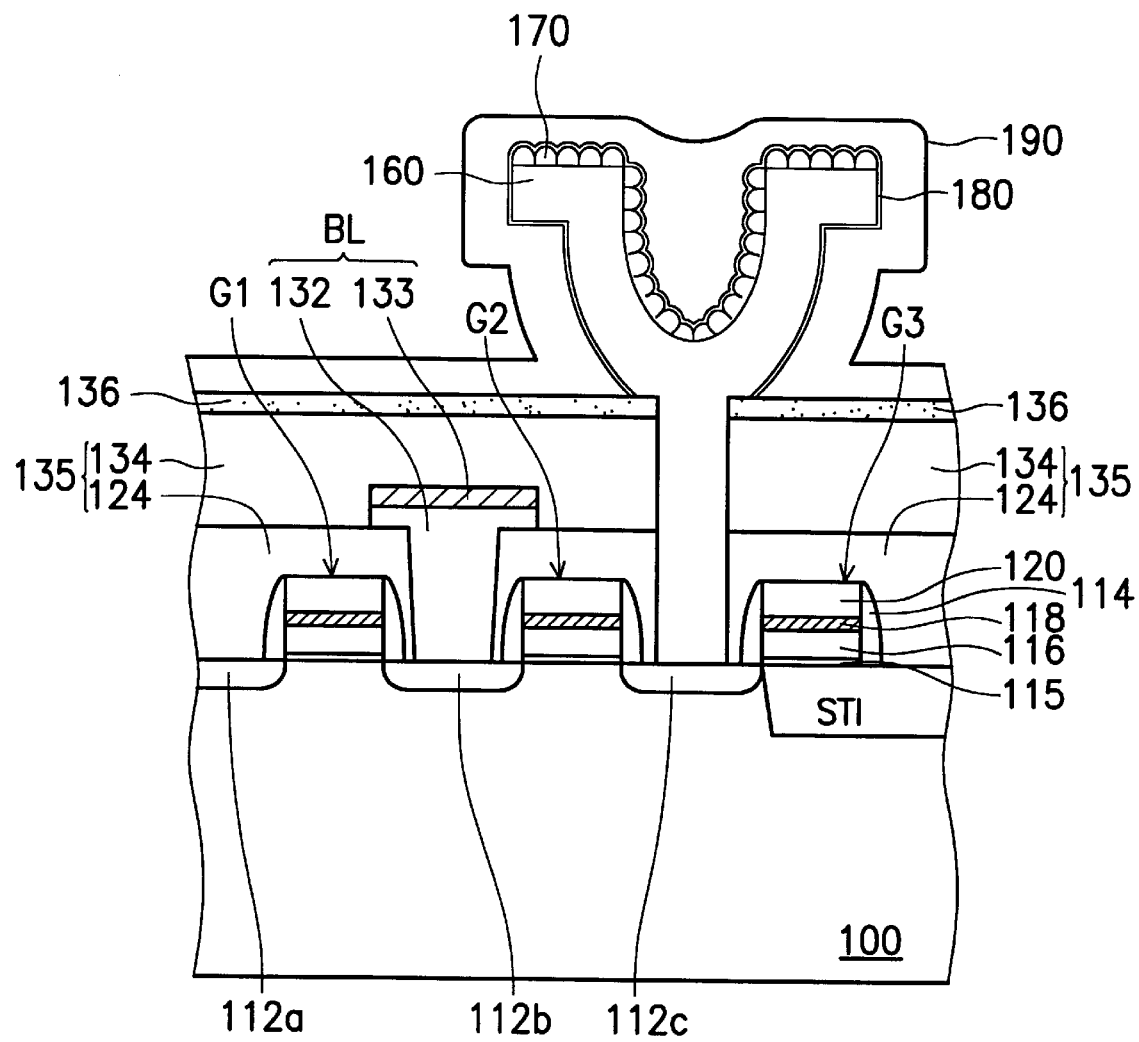

Referring to FIG. 2H, an other method to define the polysilicon layer and increase the area of the bottom electrode is to form a hemispherical-grain (HSG) layer 170 and remove the upper isolating layer 137. For example, the un-doped glass layer 137 is removed by wet etching with an etchant of HF solution such that the outer surface of the bowl-shaped bottom electrode 160 can be exposed. Thereafter, a dielectric layer 180 and an upper electrode (conducting layer) 190 are formed on the bottom electrode 160, wherein the dielectric layer 180 is a silicon dioxide/silicon nitride/silicon dioxide (ONO) layer deposited by CVD processes, and the upper electrode (conducting layer) 190 is made of polysilicon. Accordingly, the capacitance of the bowl-shaped capacitor is increased as the area of the bowl-shaped bottom electrode 160 (including inner surface and the outer surface of the electrode) increases.

It is noted that by utilizing the wet etching and the dry etching processes, the method of fabricating the bowl-shaped capacitor according to the present invention is simple, and the capacitance is increased as the area of the capacitor increases. Further, the height of the bowl-shaped capacitor is not as large as that of the conventional capacitor.

In addition, the etching stop layer 136 can prevent the bottom electrode 160 from bridging.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a DRAM capacitor, comprising the steps of:
   (a) providing a semiconductor substrate having a transistor and a bit line;
   (b) forming a lower insulating layer covering the transistor and the bit line, an etching stop layer, and an upper insulating layer;
   (c) forming a photoresist layer having an opening on the upper insulating layer;
   (d) forming a bowl-shaped opening by etching the upper insulating layer by the pattern of the opening in the photoresist layer;
   (e) forming a contact window by dry etching the etching stop layer and the lower insulating layer by the pattern of the bowl-shaped opening and the opening in the photoresist layer;
   (f) removing the photoresist layer;
   (g) forming a first conducting layer on the upper insulating layer and filling the contact window; and
   (h) forming a bowl-shaped capacitor by forming a dielectric layer and a second conducting layer on the first conducting layer.

2. The method as claimed in claim 1, wherein the lower insulating layer is an oxide layer.

3. The method as claimed in claim 1, wherein the etching stop layer is a silicon nitride layer.

4. The method as claimed in claim 1, wherein the upper insulating layer is an oxide layer.

5. The method as claimed in claim 1, wherein the bowl-shaped opening is formed by wet etching with an etchant of a HF solution.

6. The method as claimed in claim 1, wherein the first conducting layer is a polysilicon layer.

7. The method as claimed in claim 6, wherein the first conducting layer further comprises a hemispherical-grain layer.

8. The method as claimed in claim 1, wherein the step (g) further comprises the step of etching the upper insulating layer and stopping at the etching stop layer to expose the outer surface of the bowl-shaped bottom electrode.

9. The method as claimed in claim 8, wherein the upper insulating layer is removed by wet etching.

10. The method as claimed in claim 1, wherein the second conducting layer is a polysilicon layer.

11. The method as claimed in claim 1, wherein the dielectric layer is an oxide/nitride/oxide (ONO) layer.

* * * * *

UNITED STATES PATENT AND TRADEMARK OFFICE
CERTIFICATE OF CORRECTION

PATENT NO. : 6,261,900 B1
DATED : July 17, 2001
INVENTOR(S) : Wunn-Shien Liao

It is certified that error appears in the above-identified patent and that said Letters Patent is hereby corrected as shown below:

Title Page,
Item [30], Foreign Application Priority Data, change "08811940" to -- 088119400 --.

Signed and Sealed this

Twenty-fifth Day of June, 2002

*Attest:*

*Attesting Officer*

JAMES E. ROGAN
*Director of the United States Patent and Trademark Office*